United States Patent
Rice et al.

(10) Patent No.: US 7,798,309 B2
(45) Date of Patent: Sep. 21, 2010

(54) STABILIZING SUBSTRATE CARRIERS DURING OVERHEAD TRANSPORT

(75) Inventors: Michael R. Rice, Pleasanton, CA (US); Eric A. Englhardt, Palo Alto, CA (US); Robert B. Lowrance, Los Gatos, CA (US); Martin R. Elliott, Round Rock, TX (US); Jeffrey C. Hudgens, San Francisco, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1346 days.

(21) Appl. No.: 10/988,168

(22) Filed: Nov. 12, 2004

(65) Prior Publication Data

US 2005/0145464 A1    Jul. 7, 2005

Related U.S. Application Data

(60) Provisional application No. 60/520,050, filed on Nov. 13, 2003.

(51) Int. Cl.
*B65G 43/08*    (2006.01)
(52) U.S. Cl. ..................... 198/465.4; 198/683
(58) Field of Classification Search ............. 198/465.4, 198/683, 685, 680
See application file for complete search history.

(56) References Cited

U.S. PATENT DOCUMENTS

| | | | | |
|---|---|---|---|---|
| 1,817,970 | A * | 8/1931 | Da Costa | 198/683 |
| 2,725,973 | A * | 12/1955 | King | 198/683 |
| 3,190,236 | A * | 6/1965 | Leach | 198/683 |
| 3,675,754 | A * | 7/1972 | Villemaud | 198/465.4 |
| 4,029,199 | A * | 6/1977 | Reens | 198/683 |
| 4,930,425 | A * | 6/1990 | Ponisch et al. | 198/683 |
| 5,857,556 | A * | 1/1999 | Bonacorsi | 198/683 |
| 6,431,347 | B1 * | 8/2002 | Gossner | 198/465.4 |
| 6,506,009 | B1 | 1/2003 | Nulman et al. | |
| 6,745,891 | B2 * | 6/2004 | Walter et al. | 198/465.4 |
| 6,955,517 | B2 | 10/2005 | Nulman et al. | |
| 2002/0025244 | A1 | 2/2002 | Kim | |
| 2002/0090282 | A1 | 7/2002 | Bachrach | |

(Continued)

FOREIGN PATENT DOCUMENTS

EP    0663686 B1    6/1997

(Continued)

OTHER PUBLICATIONS

Weiss, Mitchell, "Evaluating 300-mm Fab Automation Technology Options and Selection Criteria", Jun. 1997, Micro, vol. 15, No. 6, pp. 65-66, 68, 70, 72, 74, 76, 78-79.

(Continued)

*Primary Examiner*—James R Bidwell
(74) *Attorney, Agent, or Firm*—Dugan & Dugan (57) ABSTRACT

In a first aspect, a first apparatus is provided for inter-station overhead transport of a substrate carrier. The first apparatus includes (1) an overhead transport mechanism; (2) a substrate carrier support suspended from the overhead transport mechanism and adapted to receive and support a substrate carrier; and (3) a stabilization apparatus adapted to limit rocking of the substrate carrier and substrate carrier support relative to the overhead transport mechanism. Numerous other aspects are provided.

12 Claims, 6 Drawing Sheets

U.S. PATENT DOCUMENTS

| | | |
|---|---|---|
| 2002/0148132 A1 | 10/2002 | Beckhart et al. |
| 2002/0197136 A1 | 12/2002 | Huang et al. |
| 2003/0040841 A1 | 2/2003 | Nasr et al. |
| 2003/0099527 A1 | 5/2003 | Mitsuyoshi |
| 2003/0202868 A1 | 10/2003 | Bachrach |

FOREIGN PATENT DOCUMENTS

| | | |
|---|---|---|
| EP | 1 071 119 | 1/2001 |
| EP | 1 074 489 | 2/2001 |
| JP | 00068350 A | 3/2000 |
| WO | WO 02/052616 | 7/2002 |

OTHER PUBLICATIONS

No-Author, "Equipe Helps Streamline 300 mm Wafer Processing", Dec. 1, 1997, Manufacturing Automation, vol. 7, No. 3, p. 1-5.

No-Author, "PRI Selected by Varian Semiconductor to Supply 300mm Integrated Front-End Buffering Solutions", Feb. 10, 2000, Newswire, p. 7434.

U.S. Appl. No. 11/248,375, filed Oct. 11, 2005, Nulman et al.

* cited by examiner

STABILIZING SUBSTRATE CARRIERS DURING OVERHEAD TRANSPORT

This application claims priority to U.S. Provisional Patent Application Ser. No. 60/520,050, filed Nov. 13, 2003, entitled "STABILIZING SUBSTRATE CARRIERS DURING OVERHEAD TRANSPORT," the content of which is hereby incorporated herein by reference in its entirety for all purposes.

CROSS REFERENCE TO RELATED APPLICATIONS

The present application is related to the following commonly-assigned, co-pending U.S. patent applications, each of which is hereby incorporated herein by reference in its entirety for all purposes:

U.S. patent application Ser. No. 10/650,310, filed Aug. 28, 2003 and titled "System For Transporting Substrate Carriers";

U.S. patent application Ser. No. 10/650,480, filed Aug. 28, 2003 and titled "Substrate Carrier Handler That Unloads Substrate Carriers Directly From a Moving Conveyor";

U.S. patent application Ser. No. 10/764,982, filed Jan. 26, 2004 and titled "Methods and Apparatus for Transporting Substrate Carriers"; and U.S. patent application Ser. No. 10/764,820, filed Jan. 26, 2004, and titled "Overhead Transfer Flange and Support for Suspending Substrate Carrier".

FIELD OF THE INVENTION

The present invention relates generally to semiconductor device fabrication systems, and is more particularly concerned with transportation of substrate carriers within a fabrication facility.

BACKGROUND OF THE INVENTION

Transportation of substrate carriers within a fabrication facility, such as between substrate processing stations and/or from a storage location to a substrate processing station, may be accomplished at least in part via hoists, e.g., overhead transport (OHT) systems. OHT's may be designed to transport many substrate carriers simultaneously along a transport path that may include straight portions and/or curved portions. For example, straight portions of the transport path may run along a cleanroom aisle populated by successive mouths of cleanroom bays, or along a cleanroom bay containing successive factory interfaces of substrate processing stations. Accordingly, curved portions of the transport path may take the form of a turn out of a cleanroom aisle and into a cleanroom bay, or vice versa.

Such an OHT system may include a rotating element and carrier supports. For example, the rotating element may be suspended at an elevated height (e.g., in the overhead of the fabrication facility) and may be rotated through/along the transport path at that elevated height. Carrier supports may be coupled to the rotating element for receiving and supporting substrate carriers, and may be spaced at regular intervals, e.g., as may be determined based on the dimensions of the substrate carriers the OHT is to carry, taking into account such inter-carrier spacing as may be necessary to avoid mechanical interference during transport, load, and/or unload operations.

The functions of removing substrate carriers from the carrier supports of such an OHT (i.e., "picking"), and loading substrate carriers on carrier supports of such an OHT (i.e., "placing"), may require at least some minimum level of precision. For example, precision and/or predictability in the location, at any given time, of carrier supports of the OHT, or of substrate carriers supported thereby, may be needed. Also, good control over the movement of load and unload equipment relative to the OHT may be required. The accomplishment of important goals such as preventing uncontrolled shifting of substrates stored in the substrate carriers, and/or protecting the substrates from damage due to excessive shocks and/or impacts, may depend on the existence of such precision and/or such control. As such, methods and apparatus for providing improved control over the position and orientation of substrate carriers being transported along an inter-station transport path are desirable (e.g., control over the position and orientation of the substrate carrier relative to the rotating element of an OHT).

SUMMARY OF THE INVENTION

In a first aspect of the invention, a first apparatus is provided for inter-station overhead transport of a substrate carrier. The first apparatus includes (1) an overhead transport mechanism; (2) a substrate carrier support suspended from the overhead transport mechanism and adapted to receive and support a substrate carrier; and (3) a stabilization apparatus adapted to limit rocking of the substrate carrier and substrate carrier support relative to the overhead transport mechanism.

In a second aspect of the invention, a second apparatus is provided for inter-station overhead transport of a substrate carrier. The second apparatus includes (1) an overhead transport mechanism; (2) a substrate carrier support suspended from the overhead transport mechanism and adapted to receive and support a substrate carrier; and (3) a rotary stabilization apparatus adapted to limit rocking of a substrate carrier supported by the substrate carrier support.

In a third aspect of the invention, a third apparatus is provided. The third apparatus includes (1) a substrate carrier support adapted to receive and support a substrate carrier; and (2) a rotary stabilization apparatus coupled to the substrate carrier support and adapted to limit rocking of a substrate carrier supported by the substrate carrier support.

In a fourth aspect of the invention, a fourth apparatus is provided. The fourth apparatus includes (1) a substrate carrier adapted to couple to and be supported by a substrate carrier support; and (2) a rotary stabilization apparatus coupled to the substrate carrier and adapted to limit rocking of the substrate carrier when the substrate carrier is supported by a substrate carrier support.

In a fifth aspect of the invention, a first method is provided for inter-station overhead transport of a substrate carrier. The first method includes the steps of (1) suspending a substrate carrier support from an overhead transport mechanism; (2) supporting a substrate carrier using the substrate carrier support; (3) transporting the substrate carrier; and (4) limiting rocking between the substrate carrier and substrate carrier support relative to the overhead transport mechanism. Numerous other aspects are provided in accordance with these and other aspects of the invention.

Other features and aspects of the present invention will become more fully apparent from the following detailed description, the appended claims and the accompanying drawings.

DETAILED DESCRIPTION

Previously incorporated U.S. patent application Ser. No. 10/650,310, filed Aug. 28, 2003, entitled "System for Transporting Semiconductor Wafer Carriers" discloses an overhead transport system for conveying substrate carriers to, from, and or between processing stations. The OHT system disclosed therein includes a rotating element that is intended to be constantly in motion during operation of the fabrication facility which it serves. The constant speed at which the rotating element of such an inter-station OHT is guided through its transport path may be high compared to typical intra-station substrate transfer speeds. For example, the constant speed of the rotating element along its transport path may be upwards of 2-3 meters/second or higher. The rotating element does not generally stop or even slow down in conjunction with the processes of picking or placing substrate carriers relative to their carrier supports.

The performance of substrate carrier picking and placing processes with respect to the carrier supports of a constantly rotating OHT may, in many circumstances, be considered to be confined within finite time frames or time "windows." To the extent that transport speeds are high, and/or the space available to accommodate a horizontal travel distance (e.g., "throw") of a load and unload apparatus (e.g., a substrate carrier handler) adjacent a particular processing tool or loadport served by the OHT is limited, associated pick and place time windows may be relatively narrow, especially in comparison to corresponding pick and place time windows associated with other types of OHTs which reduce a rotation speed, and/or which stop altogether, as part of the substrate carrier exchange function. The future may therefore place an increasingly high premium on good mechanical precision/alignment, e.g., so as to avoid excessive shock and/or impact damage to stored substrates during substrate carrier exchanges.

It is possible to conduct substrate carrier exchanges with the moving rotatable element (e.g., moving with a constant speed) of some OHT systems within one or more turns in the applicable transport path. Some other OHT systems, however, call for such exchanges to be conducted within dedicated exchange locations along straight segments of the transport path (e.g., between turns in the transport path). One reason the latter arrangement may be selected is that in certain transport applications, alignment between cooperating equipment during a constant-speed exchange may be easier and/or generally more convenient to achieve along a nominally straight line than along a curve. Another reason to restrict exchanges to straight segments of the transport path may be the potentially complicating effect of centripetal acceleration on substrate carriers passing along a curved segment of the transport path at relatively high speeds.

The present inventors have observed, however, that even exchanges conducted within straight segments of the transport path may be subject to potential complications. Specifically, the present inventors note that the task of providing adequate precision between constantly moving elements of an OHT (e.g., a rotating element, carrier supports, and/or conveyed substrate carriers) and the potentially fast-paced, high-acceleration transfer equipment for carrying out carrier exchanges (e.g., which may include substrate carrier handlers and their end effectors) is not necessarily made easy by restricting such exchanges to straight transport path segments. For example, even when substrate carriers being transported by the OHT remain firmly seated within their respective carrier supports, and when the rotating element from which such substrate carriers are suspended is made to conform closely to a straight segment of the predetermined OHT transport path (e.g., the rotating element is well-guided, e.g., via dedicated rollers, rails and/or other types of drive/guide equipment), the substrate carriers may still tend to deviate from preferred positions and orientations (e.g., relative to the rotating element) in ways which may frustrate the goal of smooth carrier exchanges. Therefore whether such exchanges take place within turns or along straight portions of a transport path, good control over substrate carrier position and orientation is an important consideration.

Figure 1:
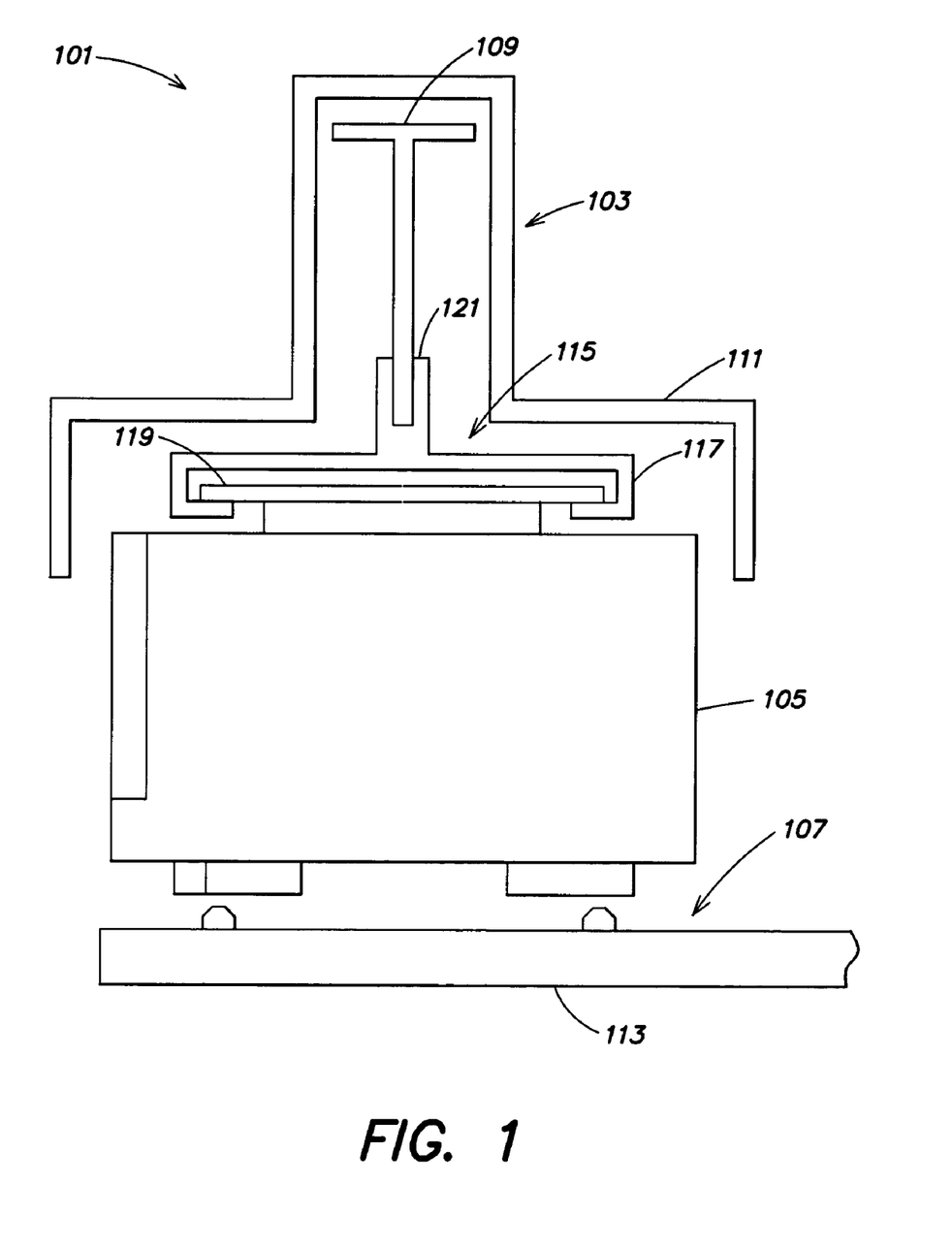
FIG. 1 is a side elevational view of an exemplary substrate carrier transportation system in accordance with an embodiment of the present invention.

FIG. 1 is a side elevational view of an exemplary substrate carrier transportation system 101. The substrate carrier transportation system 101 may include an OHT system 103 for transporting a plurality of substrate carriers 105, e.g., along an inter-station transport path (not shown—extending into the paper of FIG. 1), and a substrate carrier handler 107 for picking and/or placing substrate carrier 105 relative to the OHT system 103. The OHT system 103 may include a rotatable element 109. The rotatable element 109 may have a generally vertical orientation, such as may be formed by a band or belt supported along one lengthwise edge and hanging down therefrom. Such a rotatable element may be of continuous construction in the longitudinal direction (i.e., the direction of the transport path), or may comprise a plurality of connected segments arranged in serial along the longitudinal direction. The rotatable element 109 may be of a construction and/or may be composed of such materials so as to provide substantial geometric (e.g., dimensional) stability in the longitudinal direction of the transport path.

Applicants have observed that employing such a rotatable element 109 in the OHT system 103 of the substrate carrier transportation system 101 may provide important benefits. For example, such a rotatable element 109, if carefully guided and kept generally straight in shape, may exhibit good natural rigidity against weight-induced bowing or flexure within straight segments of the transport path. Also, such a rotatable element 109 may offer an ample extent of surface area against which to apply laterally-oriented shape-supplying forces (e.g., so as to maintain the flexure-defeating vertical orientation) and/or laterally-oriented guiding forces (so as to cause the rotatable element 109 to conform closely to a predetermined transport path, e.g., which may include many turns). Further, such a rotatable element 109, having a high aspect ratio (e.g., being relatively small in a transverse direction (i.e.

across the transport path)), may possess considerable lateral flexibility. As such, the rotatable element may be well suited to the function of navigating turns in the transport path, especially turns characterized by relatively small radii.

The rotatable element 109 may also have the ability to form a continuous (e.g., horizontally oriented) loop around a fabrication facility. This may help to ensure that the rotatable element 109 does not stray from the transport path, and may facilitate the application/transmission of rotating (i.e., driving) forces to the rotatable element 109. To the extent the overall length of such a loop may be predetermined and/or susceptible to tight control (see above description regarding longitudinal geometric stability), the value of the length may then be used as the basis for intermittent and/or regular positional calculations. For example, such a length value may be used to provide a reliable datum against which to monitor and/or ascertain or predict the positions of individual substrate carriers and/or groups of substrate carriers being transported along the transport path, as well as the positions of detectable belt features (not shown) for monitoring of the rotational position and/or rotational speed of the rotatable element 109 itself.

Other types of rotatable elements may also be used, either in conjunction with the rotatable element 109 or in the alternative. For example, a horizontally-oriented band may be used, as may be a rotatable element having ends which do not connect to form a loop (e.g., resulting in a segment-type structure adapted to snake through a larger transport path).

The OHT system 103 may further comprise one or more extrusions 111, which support 111 may be relatively rigid, both laterally and vertically. For example, the support 111 may be sufficiently vertically rigid so as to bear the weight of the rotatable element 109 and all other equipment (as well as the substrate carrier 105 and any substrates contained therein) without flexing in a manner that might compromise a transport path intended to be horizontally aligned, or to pass along a simple incline, and which may not be intended to describe a curve or bow in the vertical (i.e., when viewed from the side). As another example, the support 111 may be sufficiently horizontally rigid so as to reliably define for the rotatable element 109 a substantially straight transport path in a horizontal plane (i.e., when viewed from above). The support 111 may also comprise one or more features for accommodating equipment (not shown) for interacting with the rotatable element 109, e.g., so as to suspend the rotatable element 109 at a predetermined height relative to the extrusion 111, drive the rotatable element 109 through a transport path at least partially defined by the support 111 (e.g., the transport path may be defined in gross by successive straight and/or curved instances of the support 111 along with other straight and/or curved extrusions or similar equipment), and/or provide and maintain the vertical orientation of the rotatable element 109 (e.g., which may be beneficial for resisting weight-induced bowing).

In FIG. 1, the substrate carrier 105 is shown precisely supported by the OHT system 103 such that the position and orientation of the substrate carrier 105 (e.g., relative to the OHT system 103) is proper for purposes of a smooth exchange of the substrate carrier 105 with the substrate carrier handler 107. The substrate carrier handler 107 may comprise an end effector in the form of a movable portion 113 adapted to couple with the substrate carrier 105 (e.g., from beneath), to insert (e.g., lift) the substrate carrier 105 into the transport path, and to withdraw (e.g., lower) the substrate carrier 105 from the transport path. For example, the movable portion 113 may include one or more pins, and the substrate carrier 105 may comprise one or more complementary grooves adapted to be placed atop, and/or to kinematically interact with, the pins. The substrate carrier handler 107 may also comprise one or more actuators or similar motion-imparting equipment (not shown) to increase, maintain, or decrease a speed of the movable portion 113 of the substrate carrier handler 107 along and/or relative to the transport path, as necessary, during carrier exchanges between the substrate carrier handler 107 and the OHT system 103. The movable portion 113 of the substrate carrier handler 107 may be adapted to provide steady support, e.g., via pin-groove cooperation of complementary elements, to the substrate carrier 105 so that when the substrate carrier 105 is seated atop the movable portion 113, the movable portion 113 and the substrate carrier 105 may be reliably moved in unison, especially during instances of high horizontal acceleration (e.g., both during positive acceleration, such as just prior to actual placing/loading, and during negative acceleration, such as just prior to actual picking/unloading).

The OHT system 103 may further include multiple carrier supports 115 having a first mounting feature 117 for receiving a complementary mounting feature 119 of a substrate carrier 105, and for supporting the substrate carrier 105 during interstation transportation of the substrate carrier 105 by the OHT system 103. For example, the first mounting feature 117 of the carrier support 115 may comprise downwardly-extending fingers, and the mounting feature 119 of the substrate carrier 105 may comprise a flange adapted to be placed atop the fingers (other configurations are possible). The first mounting feature 117 of the carrier support 115 and the mounting feature 119 of the substrate carrier 105 may include one or more kinematic features (not shown) so as to provide positive location and/or orientation of the substrate carrier 105 relative to the carrier support 115 of the OHT system 103 during interstation movement of the substrate carrier 105 by the OHT system 103. For example, the kinematic features may essentially prevent the substrate carrier 105 from rotating relative to the carrier support 115 (i.e., the orientation of the substrate carrier 105 may be fixed with regard to each of roll, pitch and yaw). For another example, the kinematic features may act to ensure that the position of the substrate carrier 105 relative the carrier support 115 remains reliably fixed, e.g., along every axis but the +z direction (i.e., the vertically upward direction, e.g., in which direction the substrate carrier 105 may be permitted to move during picking and/or placing relative to the rotatable element 109 of the OHT system 103).

Each carrier support 115 may also include a second mounting feature 121 by which the carrier support 115 may be attached to the rotatable element 109 of the OHT system 103. For example, the second mounting feature 121 may be adapted to cause the carrier support 115 to assume both fixed vertical and lateral (i.e., transverse) positions relative to the rotatable element 109 as well as a fixed longitudinal position on the rotatable element 109 in the direction of the transport path. The second mounting feature 121 may further cause the carrier support 115 to assume a fixed orientation relative to the rotatable element 109, e.g., so that when the substrate carrier 105 has been placed on the OHT system 103, and when the mounting feature 119 of the substrate carrier 105 is firmly seated relative to the first mounting feature 117 of the carrier support 115, the substrate carrier 105 may assume essentially the same fixed position and orientation relative to the rotatable element 109 that the substrate carrier 105 is adapted to assume relative to the carrier support 115 (see above).

The second mounting feature 121 may alternatively be adapted to permit the carrier support 115 to assume a selectively movable position and/or orientation relative to the rotatable element 109. For example, the second mounting feature 121 may feature a flexible connection between the carrier supports and the rotatable element 109, such as may include one or more slides permitting relative translation of the carrier support 115 along the transport path and/or along the vertical direction, and/or a hinging arrangement permitting rotation about a fixed axis, and/or a global pivoting arrangement such as may include a ball-in-socket or gimbal joint. However, fixed orientations and fixed positions (e.g., with respect to all but the +z direction) as initially described may provide better and/or more reliable overall exchange-related precision for purposes of the present invention and in conjunction with the methods and apparatus disclosed herein.

Figure 2:
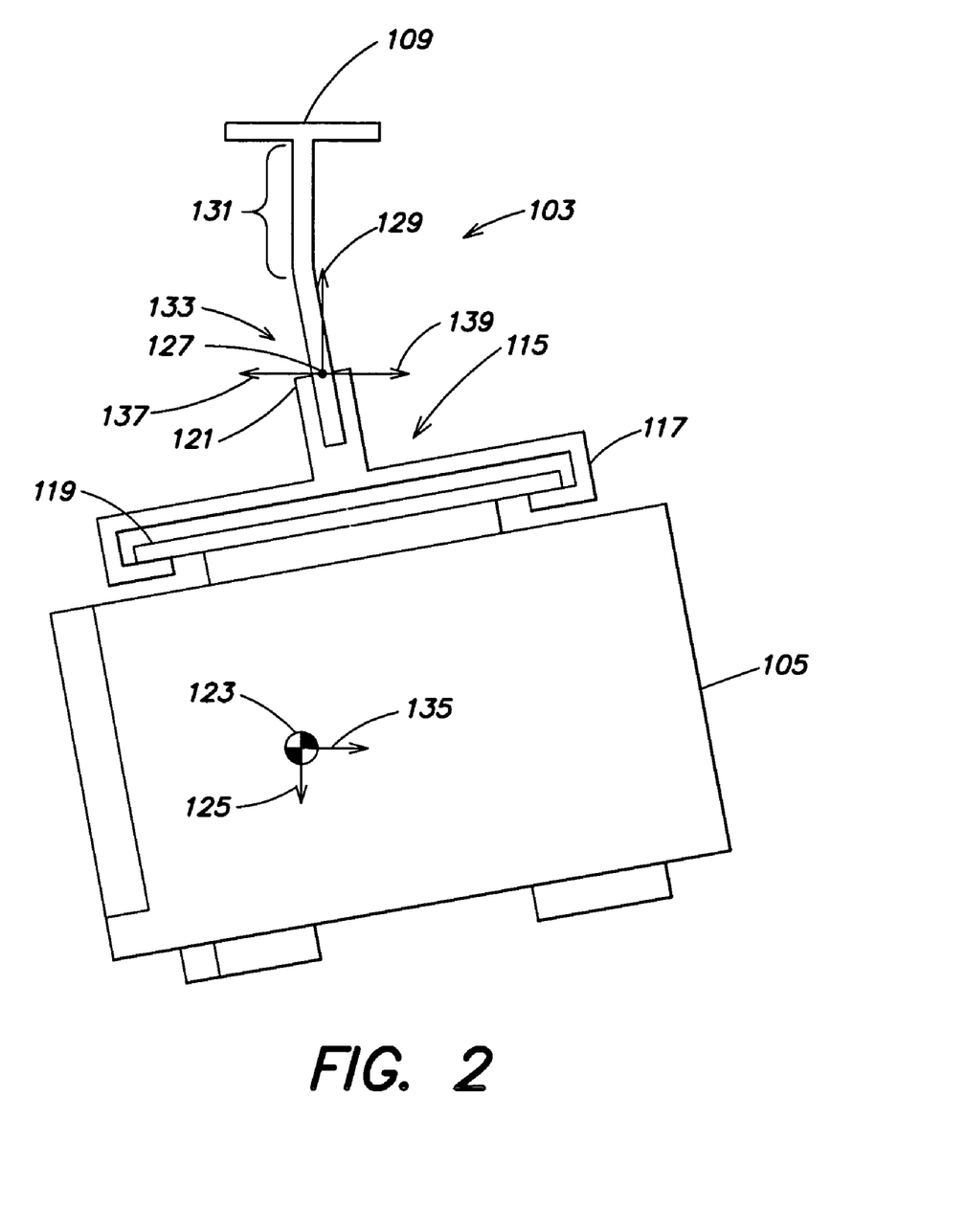
FIG. 2 is a side elevational view of a portion of the OHT system of FIG. 1 in which a substrate carrier is being carried along a transport path wherein the substrate carrier and a carrier support may have deviated from an exchange-facilitating position and orientation.

FIG. 2 is a side elevational view of a portion of the OHT system 103 of FIG. 1 in which the substrate carrier 105 is being carried along a transport path passing perpendicularly into the paper of FIG. 2, but wherein the substrate carrier 105 and the carrier support 115 may have deviated from the exchange-facilitating position and orientation shown in FIG. 1. For example, this positional and orientational deviation may occur even though the mounting feature 119 of the substrate carrier 105 may remain well seated within the first mounting feature 117 of the carrier support 115 (e.g., no dislodgement has taken place), and the second mounting feature 121 of the carrier support 115 may remain fixedly attached to the rotatable element 109. A tilt of the combined sub-assembly of the substrate carrier 105 and the carrier support 115 may contribute to this deviation. Such a tilt may arise from a vertical misalignment between a center of gravity 123 of a subassembly comprising the substrate carrier 105 and the carrier support 115 (e.g., at which a gravity force 125 may be considered to act) and a resolved point 127 at which the rotatable element 109 may be considered to apply a vertical support force 129. Even though the rotatable element 109 may be otherwise well-guided, e.g., via laterally-oriented shape-supporting and guiding forces (not shown) applied along an upper portion 131 of its depth, the rotatable element 109 may yet be susceptible to flexure, however slight, at a relatively unsupported/unguided lower portion 133. For example, a moment created by the vertical misalignment described above may cause the rotatable element 109 to deform (e.g., elastically), however slightly, such that the substrate carrier 105 and the rotatable element 109 deviate from the aligned positions and spatial orientations shown in FIG. 1.

The substrate carrier 105 may be adapted to store multiple substrates. For example, the substrate carrier 105 may be a front-opening unified pod or FOUP for storing up to 25 substrates. Applicants have observed that at least some FOUPs exhibit an effective center of gravity that shifts in space as each additional substrate is inserted or removed relative to the FOUP, and that even among FOUPs containing the same number of substrates, the position in space of the effective center of gravity may be different for each different load configuration short of a full load. The substrate carrier handler 107 (FIG. 1) may, for example, be capable of adjusting an approach angle between the movable portion 113 of the substrate carrier handler 107 and the OHT system 103 during carrier exchange operations to compensate for varying angles of tilt and thereby maintain good alignment. However, considering the sheer number of different potential tilt angles based on FOUP load configurations, schemes for providing on-the-fly approach angle adjustments may prove impractical, if not impossible in certain instances.

Centripetal and/or centrifugal forces may also contribute to such a deviation. For example, as the rotatable element 109 passes through a turn in the transport path, a centrifugal force 135 may act on the center of gravity 123 of the carrier/support subassembly. A centripetal force 137 may arise within the rotatable element 109 in opposition to the centrifugal force 135, and the centripetal force 137 may be considered to act on the resolved point 127. A moment may arise thereby which may contribute to a tilt of the subassembly outward of the turn.

The present inventors have also observed that, after passing through a turn in the transport path, the carrier/support subassembly may continue (e.g., for a brief period) to rock or swing to one side or the other relative to a proper suspended position (see, e.g., FIG. 1) below the rotatable element 109 as the carrier/support subassembly releases (e.g., gradually, over the course of multiple swings) such potential energy as it may have absorbed (and/or stored in the form of a centrifugal tilt) while passing through the turn.

When, when a carrier/support subassembly enters or leaves a given turn in a transport path, it may tend to rock and/or assume/retain a tilt for other reasons than due to residual potential energy. For example, forces and/or vibrations, represented on FIG. 2 by a transmitted force 139 acting on the resolved point 127, may be generated by centrifugal acceleration acting on other (e.g., adjacent) substrate carriers passing through the nearby turn, or by an adjacent substrate carrier having a different load configuration (e.g., resulting in a differing degree of tilt), and may be transmitted to the carrier support 115 through the rotatable element 109. The rotatable element 109 may temporarily deform and/or settle into an elastically deformed shape as a result. Still further, substrate carriers and their carrier supports may be driven into a periodic rocking motion along one or more directions (e.g., transverse, longitudinal, etc.) relative to the intended transport path, e.g., as a result of a nearby or distant source of force or vibration, applied at a frequency so as to couple with and/or drive a local natural frequency of the overall system. Other influences having a precision-degrading effect may also be observed, such as aerodynamic effects, local misalignment due to part wear, etc. Any or all such influences may give rise to a need to guide and/or correct for a positional or orientation deviation of the substrate carrier 105 or the subassembly comprising the substrate carrier 105 and the carrier support 115.

The present inventors have observed that during carrier exchanges requiring a moving element of a substrate carrier handler to achieve real-time speed-matching alignment with a rotatabe element of an OHT, such as in the case of the OHT system disclosed in previously incorporated, commonly-assigned co-pending U.S. patent application Ser. No. 10/650, 480, filed Aug. 28, 2003, entitled "SUBSTRATE CARRIER HANDLER THAT UNLOADS SUBSTRATE CARRIERS DIRECTLY FROM A MOVING CONVEYOR", even a small degree of positional or orientational misalignment between the moving element of the carrier handler and the supported substrate carriers (e.g., such as may result from the tilt, swing and/or rock described above) may significantly reduce the degree of precision achievable between the moving element and the OHT rotatable element. As inter-station transport speeds increase, this problem may increase, e.g., where such sources of imprecision may represent important limiting factors with regard to inter-station substrate carrier transport throughput.

The apparatus and methods provided in the present invention may be employed to provide positional and/or orientational correction for the substrate carrier and/or the carrier/support subassembly. For example, the inventive apparatus and methods may protect against, and reduce or minimize the precision-degrading influence the above-discussed effects may have on the substrate carrier exchange process. As a result, smoother carrier exchanges may be possible, especially at relatively high speeds. Also, exchanges may be performed along straight segments of a transport path at locations on the straight segment which may be relatively closer to an adjacent curved segment of the transport path than might otherwise have been attempted, such that more compact fabrication facility layouts may be achievable.

Figure 3:
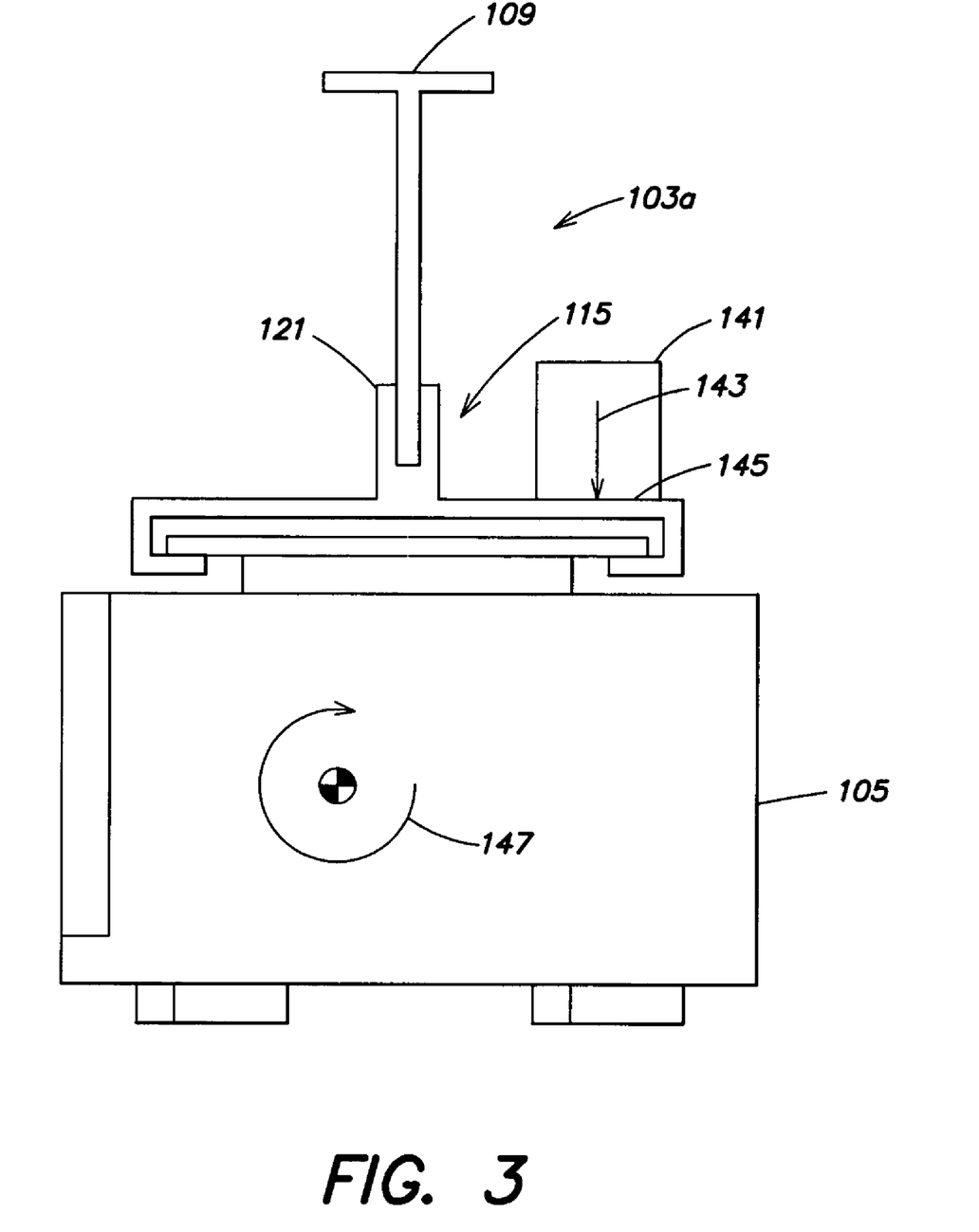
FIG. 3 is a side elevational view of a portion of an inventive OHT system for transporting a plurality of substrate carriers that further comprises a stabilization mechanism in accordance with an embodiment of the present invention.

FIG. 3 is a side elevational view of a portion of an inventive OHT system 103a for transporting a plurality of substrate carriers 105, wherein the OHT system 103a may be similar to the OHT system 103 shown in FIG. 2, and may further comprise a stabilization mechanism 141 (rendered in schematic fashion in FIG. 3). The stabilization mechanism 141 may be adapted to interact with the carrier support 115 so as to correct for and/or prevent a positional and/or orientational deviation thereof as the substrate carrier 105 is transported along the transport path of the OHT system 103a. For example, the stabilization mechanism 141 may be caused to assume a stationary position and may be incorporated within the OHT system 103a (e.g., the stabilization mechanism 141 may be coupled to the support 111 (FIG. 1) of the OHT system 103a so as to take advantage of the inherent stiffness of the extrusion 111), and/or may be coupled to rigid portions of the overhead of the fabrication facility.

The stabilization mechanism 141 may be caused to apply a guiding force 143 to a complementary reaction surface 145 of the carrier support 115, e.g., either via actual contact between the stabilization mechanism 141 and the carrier support 115, or via non-contact interaction between the same (e.g., such as via magnetic attraction/repulsion, or via interposition of a guiding air cushion). The guiding force 143 may also be applied so as to create in the carrier/support subassembly a moment 147, and a combination of the guiding force 143 and the moment 147 may be sufficient to counteract one or more of the forces and/or moments described above (see also FIG. 2) which may tend to cause the carrier/support subassembly to deviate from proper positional and orientational alignment.

The stabilization mechanism 141 may be adapted to address and/or interact with the carrier support 115 at one or more reaction surfaces 145 of the carrier support 115 disposed along either or both sides of the rotatable element 109 of the OHT system 103a. The interaction of the stabilization mechanism 141 with passing instances of the carrier support 115 may occur regularly (e.g., each and every passing instance of the carrier support 115 being addressed by the stabilization mechanism 141 so as to correct and/or prevent what would otherwise be a chronic local misalignment) or as needed (e.g., only those passing instances of the carrier support 115 requiring positional and/or orientational adjustment being addressed by the stabilization mechanism 141). For example, at a location along the transport path at which a direction of deviation/misalignment may be determined in advance (e.g., by virtue of a known imbalance or in the case of a sharp enough turn in the transport path), the stabilization mechanism 141 may be caused to address the carrier support 115 along only one side of the rotatable element 109 of the OHT system 103a, as illustrated in FIG. 3. For another example, at a location along the transport path at which deviation/misalignment is known to be a problem, but with respect to which a direction of deviation/misalignment may not be determined/determinable in advance (e.g., by virtue of passing instances of the substrate carrier 105 having varying locations for their centers of gravity or in the case of a tendency on the part of passing instances of the substrate carrier 105 to swing beneath the rotatable element 109 of the OHT system 103a), the stabilization mechanism 141 may be caused to address the carrier support 115 along both sides of the rotatable element 109 of the OHT system 103a (e.g., as needed, or regularly with each carrier support.

As stated above, any appropriate surface of the carrier support 115 may comprise a reaction surface 145, including one or more portions of the second mounting feature 121 of the carrier support 115, or one or more portions of the first mounting feature 117 of the carrier support 115. Also, instances of the reaction surface 145 of the carrier support 115 may take the form of one or more of many different shapes, including flat or curved, and may comprise one of many different orientations, including generally horizontal, generally vertical, or inclined relative to the horizontal and/or the vertical. Further, all or a portion of a reaction surface 145 may be either stationary relative to the remainder of the carrier support 115 or adapted to move relative to the carrier support 115, e.g., as may be required by the particular embodiment of the stabilization mechanism 141 employed. The stabilization mechanism 141 may also be configured so as to ordinarily not achieve contact (and/or not achieve non-contact interaction) with the reaction surface 145 of carrier support 115 until such time as the carrier support 115 has moved (e.g., by swinging, rocking, tilting, etc.) relative to the rotatable element 109 to a nearly unacceptable extent (e.g., deflection from an aligned condition sufficient to risk damage to a stored substrate during a carrier exchange with the OHT system 103a).

Figure 4:
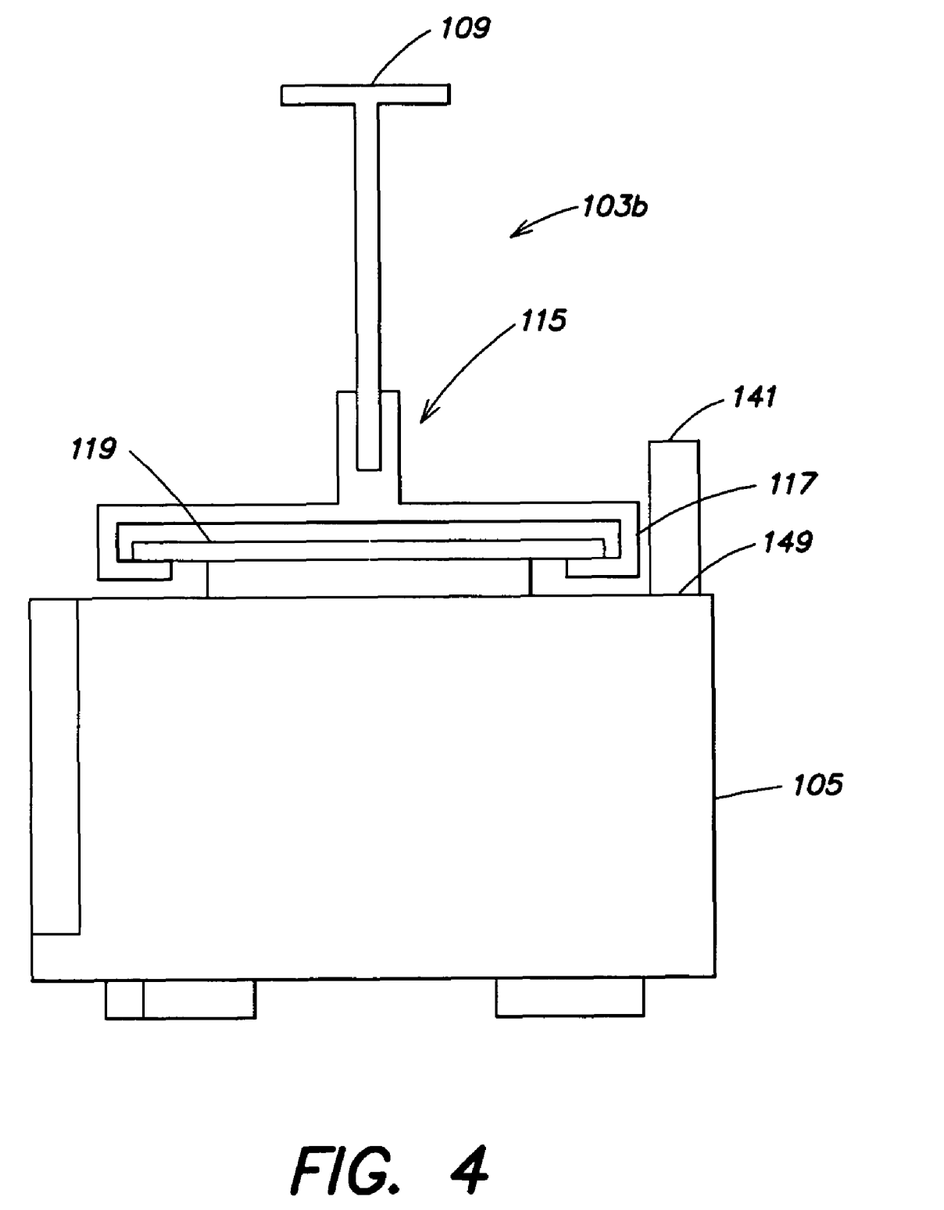
FIG. 4 is a side elevational view of a portion of an inventive OHT system for transporting a plurality of substrate carriers, wherein the stabilization mechanism is adapted to interact with a surface of the substrate carrier in accordance with an embodiment of the present invention.

FIG. 4 is a side elevational view of a portion of an inventive OHT system 103b for transporting a plurality of substrate carrier 105, wherein the OHT system 103b may be similar to the OHT system 103a shown in FIG. 3, except that the schematically-drawn stabilization mechanism 141 is adapted to interact with a complementary reaction surface 149 of the substrate carrier 105, rather than with a similar surface of the carrier support 115 as in the OHT system 103a of FIG. 3. The stabilization mechanism 141 may be employed in the OHT system 103b so as not to cause the mounting feature 119 of the substrate carrier 105 to become unseated relative to the first mounting feature 117 of the carrier support 115 and/or so as not to disrupt the positive control over the substrate carrier 105 generally provided by the carrier support 115.

Like the reaction surface 145 in FIG. 3, the reaction surface 149 of the substrate carrier 105 may be one of many different shapes, including flat or curved, and may have one of many different orientations, including generally horizontal, generally vertical, or inclined relative to the horizontal and/or the vertical. The stabilization mechanism 141 may also be configured so as to not ordinarily be in contact (and/or not ordinarily achieve non-contact interaction) with the reaction surface 149 of substrate carrier 105 until such time as the substrate carrier 105 has moved (e.g., by swinging, rocking, tilting, etc.) to a nearly unacceptable extent.

Figure 5:
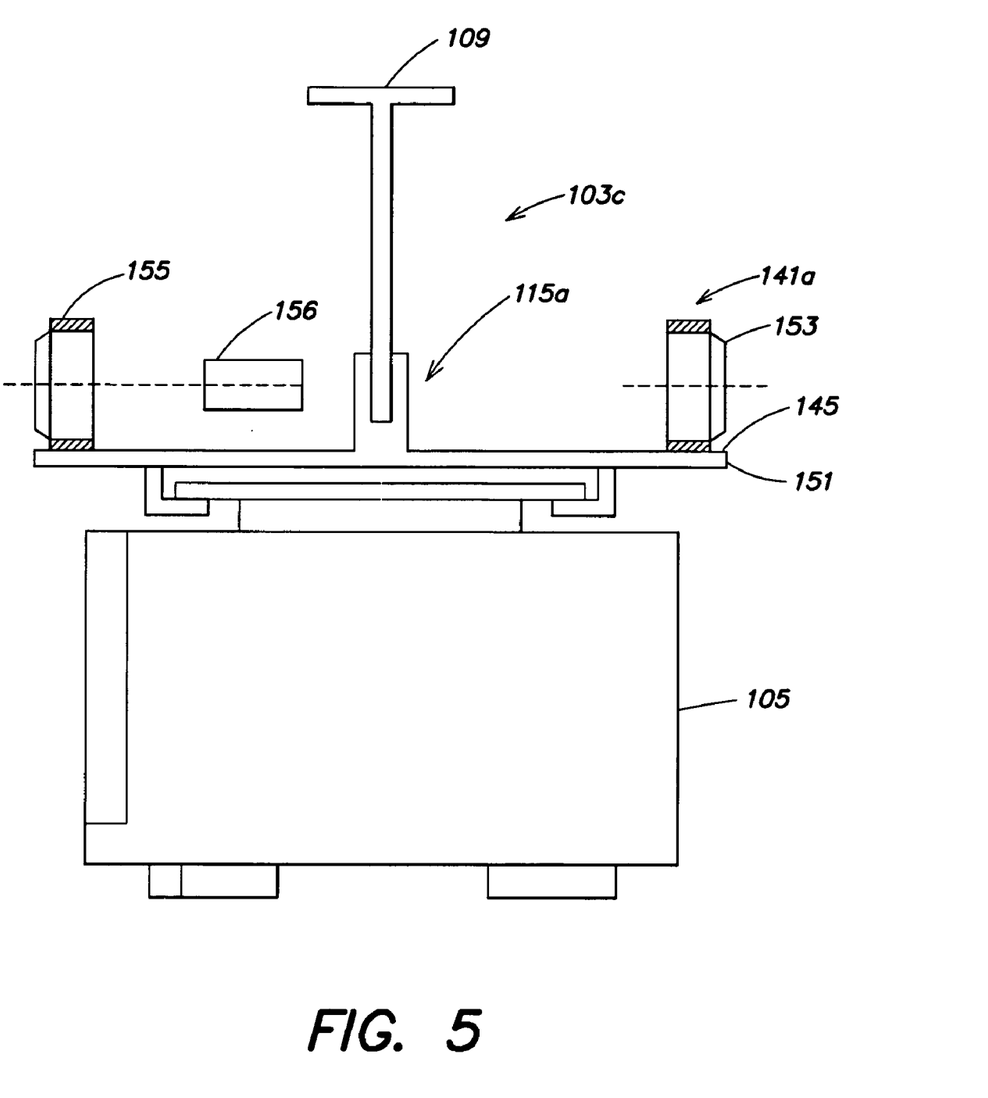
FIG. 5 is a side elevational view of a portion of an inventive OHT system for transporting a plurality of substrate carriers in accordance with another embodiment of the present invention.

FIG. 5 is a side elevational view of a portion of an inventive OHT system 103c for transporting a plurality of substrate carriers 105, wherein the OHT system 103c may be an embodiment of the OHT system 103a shown in FIG. 3, having characteristics similar to that described with respect thereto, and additional features as described below. Referring to FIG. 5, the OHT system 103c may comprise a carrier support 115a similar to the carrier support 115 of FIG. 3, and offering one or more reaction surfaces 145 of flanges 151 which may extend laterally in cantilevered fashion from one or more centrally-disposed elements of the carrier support 115 (e.g., from one or more instances of a first mounting feature 117 of the carrier support 115). The OHT system 103c may also comprise a stabilization mechanism 141a similar to the stabilization mechanism 141 of FIG. 3, and comprising one or more rollers 153, each roller 153 being adapted to contact (directly or indirectly via a track as described below)

one or more reaction surfaces 145 of a flange 151 of the carrier support 115a for guiding the carrier support 115a and/or correcting a positional and/or orientation deviation (e.g., relative to the OHT system 103c) of the carrier support 115a.

The stabilization mechanism 141a of the OHT system 103c may further comprise a plurality of rollers 153 rotatably disposed along either or both sides of the rotatable element 109. The stabilization mechanism 141a may also comprise one or more tracks 155, and groups of rollers 153 disposed in a longitudinal series along a given side of the rotatable element 109 may be utilized in unison to drive and/or be driven by such a track 155. Each such track 155 may be caused to achieve guiding or corrective contact with the carrier support 115a, during which the track 155 may be caused to rotate at a speed sufficient to match a linear velocity of passing instances of the carrier support 115a along the transport path so as to reduce and/or eliminate the possibility of the track 155 rubbing against the carrier support 115a and creating particles via rubbing friction. Each track 155 may comprise any suitable material, e.g., materials that resist particle generation.

Rotation of the tracks and/or wheels may be caused, e.g., on demand intermittently as needed, cyclically, or continuously. Continuous rotation may be desirable, so as to substantially preclude both particle generating friction as well as to avoid subjecting the rollers 153 (and/or the track 155) to unacceptably high levels of rotational acceleration (e.g., acceleration sufficient to create an undue level of vibration within the OHT system 103c). Such acceleration may be caused by abrupt (e.g., because of mismatched speeds) contact between the rollers 153 (and/or the track 155) with the carrier support 115a and/or may be caused by a quick rotational ramp-up of rotational speed just before contact with the carrier support 115a. Accordingly, the rollers may be mechanically linked to, and/or may be urged into rotation by one or more actuators such as the actuator 156 shown in FIG. 5, which may comprise, for example, any suitable type of motor or torquing device. The actuator 156 may be part of the OHT system 103c, and may be mounted to a support 111 (FIG. 1) of the OHT system 103c, and/or may be mounted to some other structure, such as the factory overhead. Alternatively, and according to some embodiments of the present invention, the tracks and/or wheels are not normally driven by an actuator or motor, and may be urged into rotation via contact with passing instances of the carrier support 115a.

Figure 6:
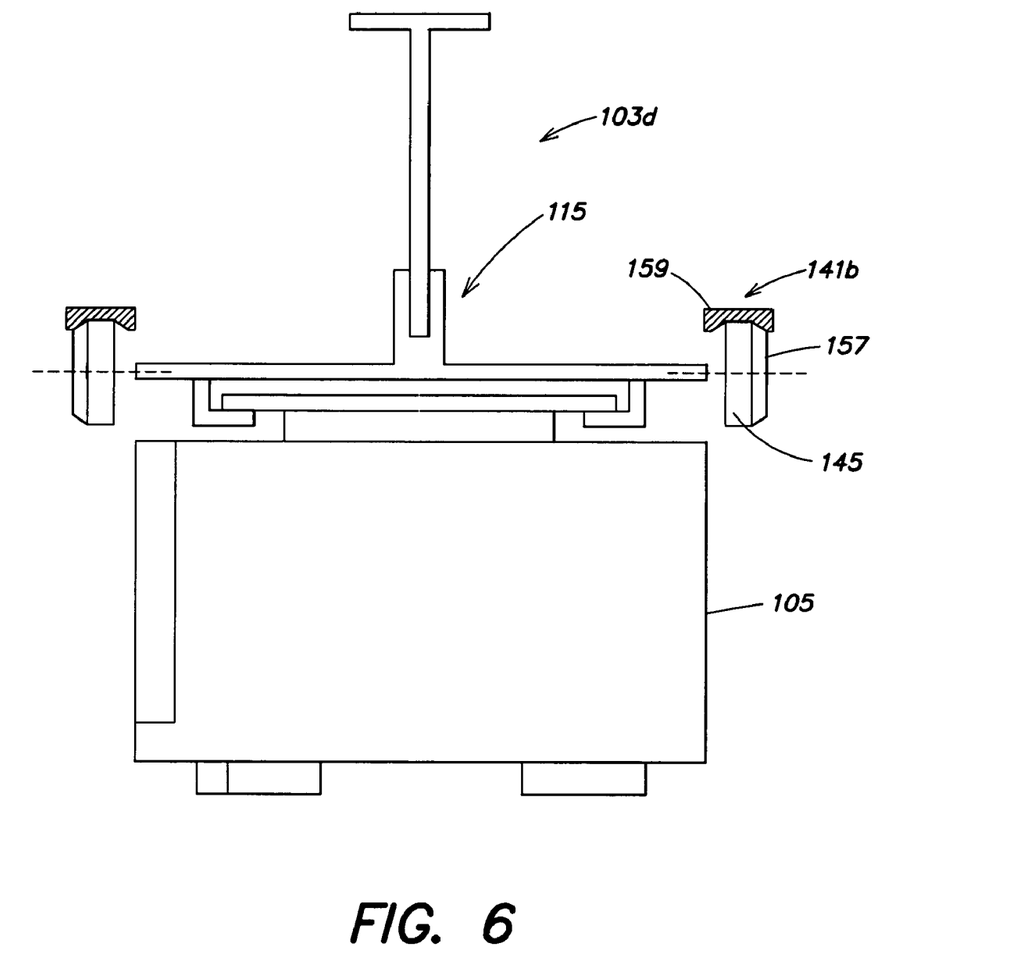
FIG. 6 is a side elevational view of a portion of an inventive OHT system for transporting a plurality of substrate carriers in accordance with another embodiment of the present invention.

FIG. 6 is a side elevational view of a portion of an inventive OHT system 103d for transporting a plurality of substrate carriers 105, wherein the OHT system 103d may be an embodiment of the OHT system 103a shown in FIG. 3, having characteristics similar to that described above, and additional features as described below. Referring to FIG. 6, each carrier support 115 of the OHT system 103d may include one or more support rollers 157, each support roller 157 being mounted on the carrier support 115 for axial rotation relative thereto, and for translational motion along the transport path therewith. The OHT system 103d may also comprise a stabilization mechanism 141b similar to the stabilization mechanism 141 of FIG. 3, and comprising one or more rails 159, each rail 159 being adapted to receive one or more of a reaction surface 145 of a support roller 157 (a moving track may also/alternatively be used) of the carrier support 115 for guiding the carrier support 115 and/or correcting a positional and/or orientation deviation (e.g., relative to the OHT system 103d) of the carrier support 115.

As described above, no particular orientation of any rail 159 or support roller 157 need necessarily be specified herein, any suitable orientation being acceptable, as long as corresponding instances of the rail 159 and the support roller 157 are sufficiently aligned with each other, for purposes of substrate carrier guidance or correction of a deviation of the substrate carrier's position or orientation. Further, each support roller 157 may be caused to rotate so as to cause the reaction surface 145 to achieve a net tangential speed of zero relative to the corresponding surface of the rail 159 so as to avoid rubbing thereagainst e.g., on demand, cyclically, or continuously. In embodiments where each support roller 157 is caused to rotate, one or more actuators similar to the actuator 156 of FIG. 5, or other suitable means of rotation, may be employed and as such the motor or means of rotation may be mounted for movement along with the carrier support 115. Passive rotation of each support roller 157 may be employed in other embodiments, and such passive rotation may occur in a manner similar to that described above with respect to FIG. 5. Each support roller 157 and rail 159 may comprise any suitable material, e.g., materials that resist particle generation.

The foregoing description discloses only particular embodiments of the invention; modifications of the above disclosed methods and apparatus which fall within the scope of the invention will be readily apparent to those of ordinary skill in the art.

While the present invention has been described primarily with reference to wafers, it will be understood that the invention also may be employed with other substrates such as a silicon substrate, a mask, a reticule, a glass plate, etc., whether patterned or unpatterned; and/or with apparatus for transporting and/or processing such substrates.

It should be understood that in some embodiments so long as the stabilization apparatus is adapted to prevent or limit rocking between the substrate carrier and the substrate carrier support, the stabilization apparatus can be (1) a two part apparatus having one part coupled either to the substrate carrier or to the substrate carrier support, and the other part coupled adjacent thereto; or (2) a single part apparatus coupled either to the substrate carrier or to the substrate carrier support and adapted to contact a surface adjacent thereto, or coupled adjacent the substrate carrier or substrate carrier support and adapted to contact a surface of the substrate carrier or substrate carrier support.

Accordingly, while the present invention has been disclosed in connection with specific embodiments thereof, it should be understood that other embodiments may fall within the spirit and scope of the invention, as defined by the following claims.

What is claimed is:

1. An apparatus for inter-station overhead transport of a substrate carrier, comprising:
   an overhead transport mechanism;
   a substrate carrier support suspended from the overhead transport mechanism and adapted to receive and support a substrate carrier; and
   a stabilization apparatus adapted to limit rocking of the substrate carrier and substrate carrier support relative to the overhead transport mechanism
   wherein the stabilization apparatus is operatively coupled to the substrate carrier.

2. The apparatus of claim 1 wherein the stabilization apparatus is further adapted to interact with the substrate carrier so as to correct positional or orientational deviation of the substrate carrier relative to the overhead transport mechanism, thereby limiting rocking of the substrate carrier and substrate carrier support relative to the overhead transport mechanism.

3. The apparatus of claim 1 wherein the stabilization apparatus is further adapted to interact with the substrate carrier so as to prevent a mounting feature of the substrate carrier from becoming unseated relative to a corresponding mounting feature of the substrate carrier support.

4. The apparatus of claim 1 wherein:
the stabilization apparatus includes one or more rollers coupled to the substrate carrier; and
a rail adapted to:
receive the one or more rollers; and
at least one of:
guide the substrate carrier support; and
correct positional or orientational deviation of the substrate carrier support relative to the overhead transport mechanism;
thereby limiting rocking of the substrate carrier and substrate carrier support relative to the overhead transport mechanism.

5. The apparatus of claim 4 wherein the stabilization apparatus is adapted to reduce friction between the stabilization apparatus and the substrate carrier support, thereby reducing particle generation during transport.

6. The apparatus of claim 4 wherein:
the stabilization apparatus further includes a track coupled to the one or more rollers; and
the rail is adapted to receive the one or more rollers via the track.

7. The apparatus of claim 4 further comprising an actuator for rotating the one or more rollers.

8. An apparatus for inter-station overhead transport of a substrate carrier, comprising:
an overhead transport mechanism;
a substrate carrier support suspended from the overhead transport mechanism and adapted to receive and support a substrate carrier; and
a rotary stabilization apparatus adapted to limit rocking of a substrate carrier supported by the substrate carrier support
wherein the rotary stabilization apparatus is further adapted to reduce friction between the rotary stabilization apparatus and substrate carrier support, thereby reducing particle generation during transport.

9. An apparatus for inter-station overhead transport of a substrate carrier, comprising:
an overhead transport mechanism;
a substrate carrier support suspended from the overhead transport mechanism and adapted to receive and support a substrate carrier; and
a rotary stabilization apparatus adapted to limit rocking of a substrate carrier supported by the substrate carrier support wherein the rotary stabilization apparatus includes one or more rollers adapted to:
contact the substrate carrier support;
at least one of:
guide the substrate carrier support; and
correct a positional or orientational deviation of the substrate carrier support relative to the overhead transport mechanism;
thereby limiting rocking of the substrate carrier supported by the substrate carrier support
wherein:
the rotary stabilization mechanism includes
a track; and
the one or more rollers are adapted to contact the substrate carrier support via the track.

10. An apparatus, comprising:
a substrate carrier adapted to couple to and be supported by a substrate carrier support; and
a rotary stabilization apparatus coupled to the substrate carrier and adapted to limit rocking of the substrate carrier when the substrate carrier is supported by a substrate carrier support.

11. A method for inter-station overhead transport of a substrate carrier, comprising:
suspending a substrate carrier support from an overhead transport mechanism;
supporting a substrate carrier using the substrate carrier support;
transporting the substrate carrier; and
limiting rocking between the substrate carrier and substrate carrier support relative to the overhead transport mechanism.

12. The method of claim 11 wherein limiting rocking of the substrate carrier and substrate carrier support relative to the overhead transport mechanism includes contacting the substrate carrier support to limit rocking of the substrate carrier and substrate carrier support relative to the overhead transport mechanism.

\* \* \* \* \*